(12) United States Patent
Hall et al.

(10) Patent No.: US 10,886,209 B2
(45) Date of Patent: Jan. 5, 2021

(54) MULTIPLE-LAYER, SELF-EQUALIZING INTERCONNECTS IN PACKAGE SUBSTRATES

(71) Applicant: Intel Corporation, Santa Clara, CA (US)

(72) Inventors: Stephen Harvey Hall, Forest Grove, OR (US); Bok Eng Cheah, Bukit Gambir (MY); Chaitanya Sreerama, Hillsboro, OR (US); Jackson Chung Peng Kong, Tanjung Tokong (MY)

(73) Assignee: Intel Corporation, Santa Clara, CA (US)

( * ) Notice: Subject to any disclaimer, the term of this patent is extended or adjusted under 35 U.S.C. 154(b) by 22 days.

(21) Appl. No.: 16/326,544

(22) PCT Filed: Sep. 30, 2016

(86) PCT No.: PCT/US2016/054939
§ 371 (c)(1),
(2) Date: Feb. 19, 2019

(87) PCT Pub. No.: WO2018/063380
PCT Pub. Date: Apr. 5, 2018

(65) Prior Publication Data
US 2019/0214336 A1  Jul. 11, 2019

(51) Int. Cl.
*H01L 23/498* (2006.01)
*H01L 23/66* (2006.01)
*H01L 21/48* (2006.01)

(52) U.S. Cl.
CPC .... *H01L 23/49822* (2013.01); *H01L 21/4857* (2013.01); *H01L 23/49811* (2013.01);
(Continued)

(58) Field of Classification Search
CPC combination set(s) only.
See application file for complete search history.

(56) References Cited

U.S. PATENT DOCUMENTS

| | | |
|---|---|---|
| 2010/0055393 A1 | 3/2010 | Park et al. |
| 2010/0283559 A1 | 11/2010 | Conn |

(Continued)

FOREIGN PATENT DOCUMENTS

| | | |
|---|---|---|
| JP | 2011508977 A | 3/2011 |
| WO | WO-2018063380 A1 | 4/2018 |

OTHER PUBLICATIONS

"International Application Serial No. PCT/US2016/054939, International Search Report dated Jun. 30, 2017", 4 pgs.

(Continued)

*Primary Examiner* — Nduka E Ojeh
(74) *Attorney, Agent, or Firm* — Schwegman Lundberg & Woessner, P.A.

(57) ABSTRACT

A self-equalizing interconnect in a connector is installed in a microelectronic device. The self-equalizing interconnect is formed of a plurality of electrically conductive layers under conditions to offset skin-effect losses with respect to frequency change during operation. Each successive layer is configured to with the next highest electrical conductivity and subsequent electrically conductive films gradually decrease in electrical conductivity. In an embodiment, thickness of the conductive film adjacent the reference plain is configured thinnest and subsequent films are added and are seriatim gradually thicker. The highest electrically conductive film is configured closest to a reference plane in the connector, and the lowest electrically conductive film is farthest from the reference plane.

24 Claims, 9 Drawing Sheets

(52) U.S. Cl.
CPC ........ *H01L 23/49866* (2013.01); *H01L 23/66* (2013.01); *H01L 23/498* (2013.01)

(56) References Cited

U.S. PATENT DOCUMENTS

| | | | |
|---|---|---|---|
| 2014/0016686 A1* | 1/2014 | Ben Artsi | H01L 23/66 375/230 |
| 2014/0225265 A1* | 8/2014 | Sidhu | H01L 24/81 257/758 |
| 2016/0099365 A1* | 4/2016 | Luch | H01L 31/0508 136/256 |
| 2016/0314876 A1* | 10/2016 | Charbonneau-Lefort | H01B 3/02 |
| 2018/0096931 A1* | 4/2018 | Huang | H01L 23/5223 |

OTHER PUBLICATIONS

"International Application Serial No. PCT/US2016/054939, International Written Opinion dated Jun. 30, 2017", 6 pgs.

\* cited by examiner

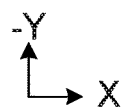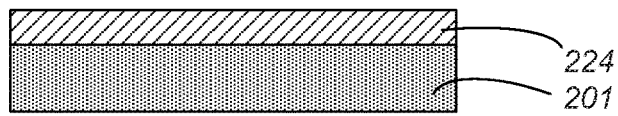
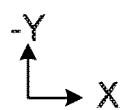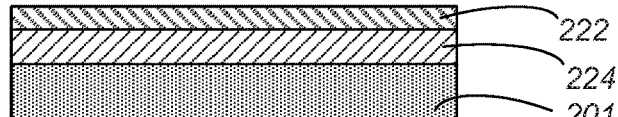
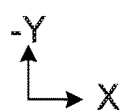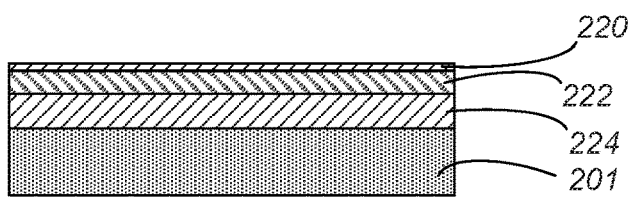
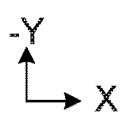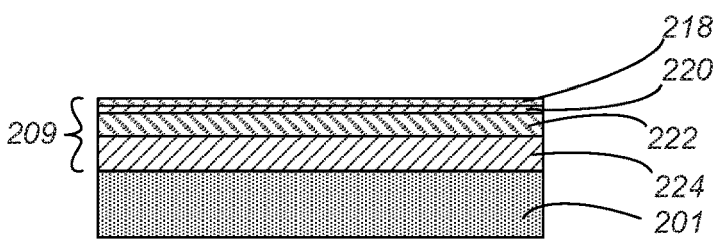
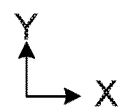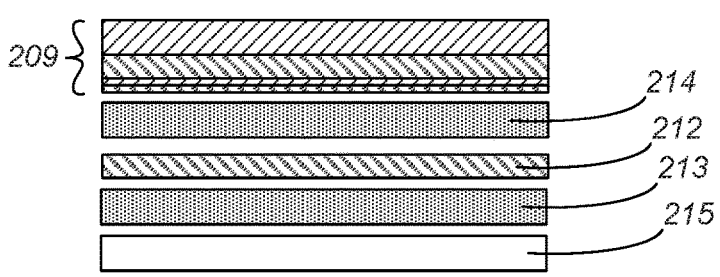
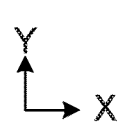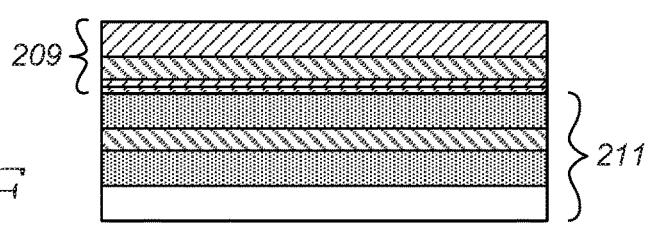

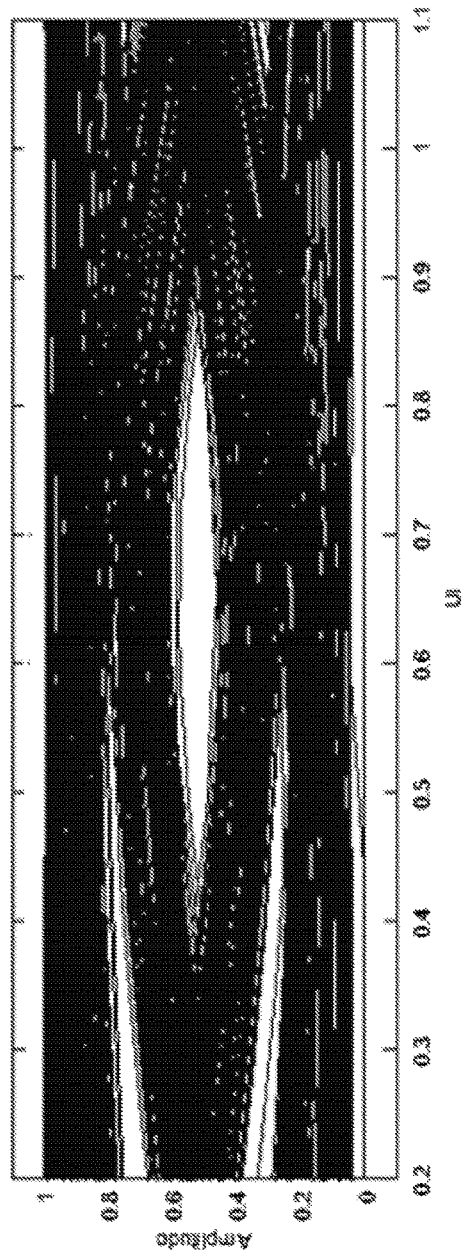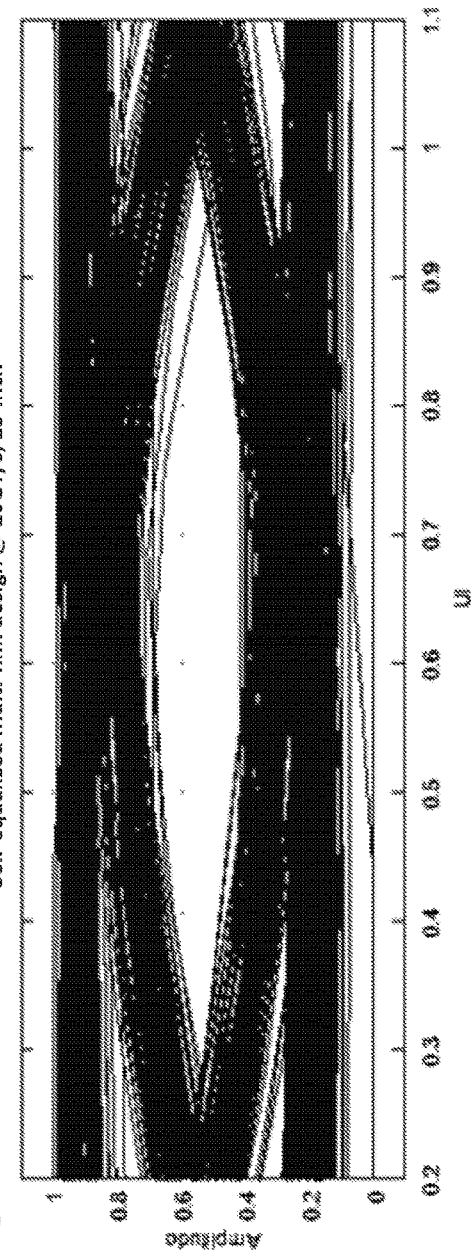
Fig. 3A
Fig. 3B

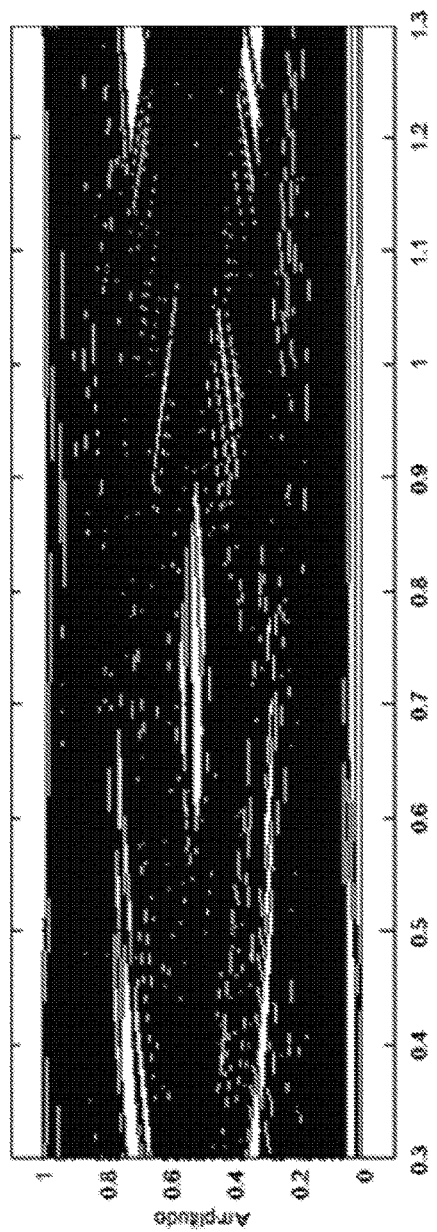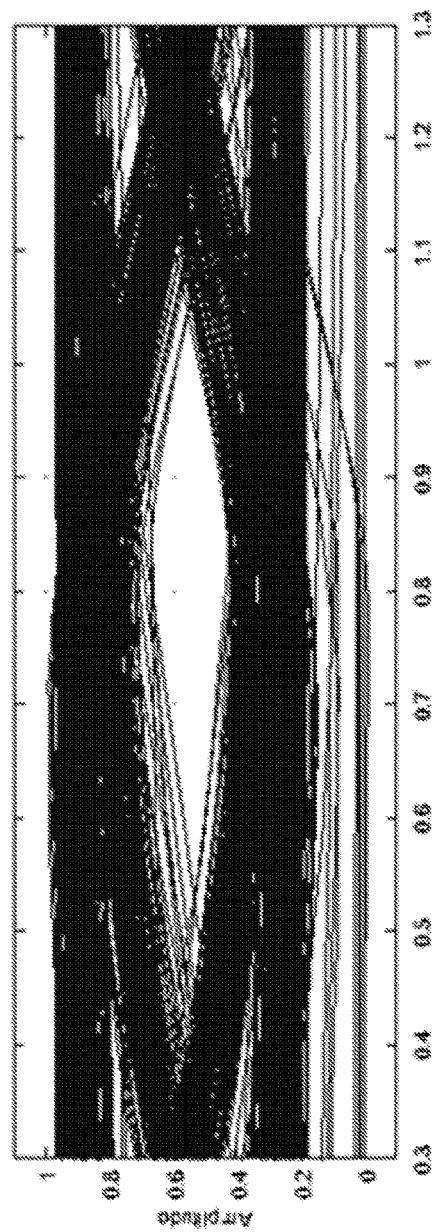
Fig. 4A
Fig. 4B

MULTIPLE-LAYER, SELF-EQUALIZING INTERCONNECTS IN PACKAGE SUBSTRATES

CLAIM OF PRIORITY

This patent application is a U.S. National Stage Application under 35 U.S.C. 371 from international Application No. PCT/US2016/054939, filed Sep. 30, 2016, published as WO2018/063380, which is incorporated herein by reference.

FIELD

This disclosure relates to signal trace technology in semiconductor device package substrates.

BACKGROUND

Skin-effect losses of interconnects with respect to frequency change negatively impacts inter-symbolic interference (ISI). ISI leads to signal integrity degradations. Loss of a portion of a useful electrical conductor due to current tending toward the conductor skin is a parameter to monitor during interconnect design in semiconductor device package substrates.

BRIEF DESCRIPTION OF THE DRAWINGS

FIGS. 2A, 2B, 2C, 2D, 2E, 2F, 2G, 2H, 2K and 2M illustrate process flow embodiments for creating self-equalized interconnect embodiments.

FIGS. 3A and 3B are graphs illustrating comparative insertion loss with respect to skin effect as a function of frequency according to an embodiment.

FIGS. 4A and 4B are graphs illustrating comparative insertion loss with respect to skin effect as a function of frequency according to an embodiment.

DETAILED DESCRIPTION

Embodiments of the invention address skin-effect losses, which is the tendency of electrical signal to concentrate current toward the trace periphery or "skin" proportional to increasing signal frequency.

Disclosed embodiments include self-equalized interconnects. In an embodiment, the self-equalized interconnect is a multiple-layer connector that is installed as part of a flex cable device. In an embodiment, the self-equalized interconnect is a multiple-layer connector that is installed as part of a high-speed interconnect that operates in a range from about 0.3 GHz to about 10 GHz. In an embodiment, the self-equalized interconnect is a multiple-layer connector that is installed as part of a flexible printed wiring board that is installable into a flexible and animal-wearable device.

In an embodiment, the self-equalized interconnect (SEI) is a signal trace that includes at least two conductive trace films. The term "trace" refers to an electrical trace such as is used on a printed wiring board. The SEI conductive trace films create gradients of metal conductivity and thickness. The conductive film adjacent to the reference plane (separated only by a proximal dielectric) is configured with the highest electrical conductivity and subsequent electrically conductive films gradually decrease in electrical conductivity. In an embodiment, thickness of the conductive film adjacent the reference plane is configured thinnest and subsequent films are added and are seriatim gradually thicker in what may be referred to as a "thickness gradient." This means according to an example embodiment, the thinnest electrically conductive film in a self-equalizing interconnect has the highest electrical conductivity. Also in this example embodiment, the thinnest electrically conductive film is closest to the reference plane, and the thickest electrically conductive film is farthest from the reference plane and has the lowest electrical conductivity.

Figure 1:
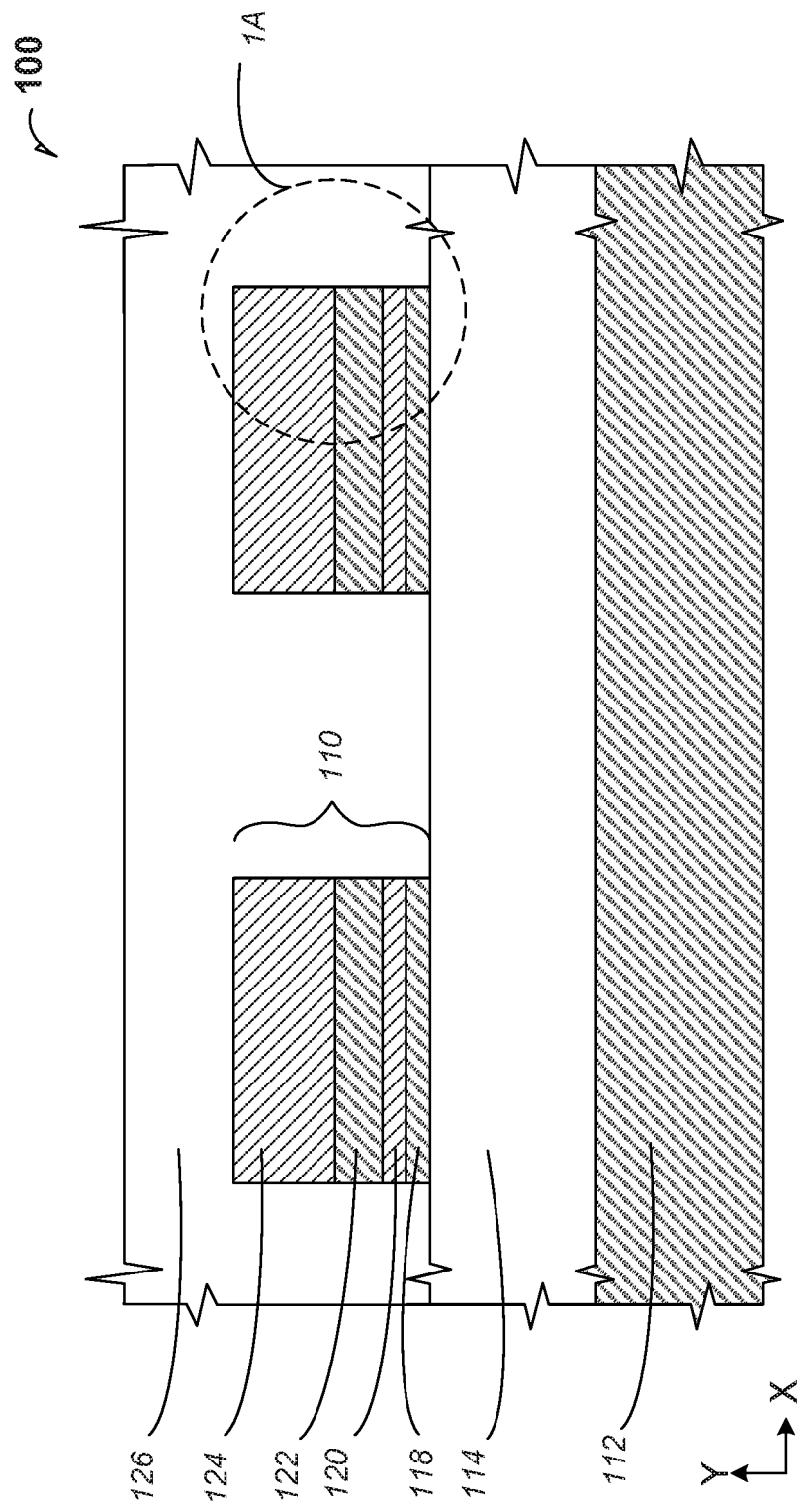
FIG. 1 is cross-section elevation of a portion of a package substrate including a self-equalizing interconnect trace according to an embodiment.

FIG. 1 is a cross-section elevation of a self-equalizing interconnect 100 according to an embodiment. The interconnect 100 is a trace and it shows part of a package substrate including a reference plane 112 and a dielectric film 114 that insulates the reference plane 112 from a self-equalizing interconnect (SEI) 110 according to an embodiment. In an embodiment, the reference plane 112 is a copper material. The SEI 110 may also be referred to as a signal trace 110. The SEI 110 may also be referred to as a self-equalized multi-film signal trace 110. The SEI 110 is overmolded with a dielectric material 126 such as a Mylar® film according to an embodiment.

The SEI 110 includes an electrically conductive first film 118 and an electrically conductive subsequent film 124 according to an embodiment. In this embodiment, the electrically conductive subsequent film 124 is disposed directly on the electrically conductive first film 118. In an embodiment, the electrically conductive subsequent film 124 is thicker than the electrically conductive first film 118. In an embodiment, the electrically conductive first film 118 has a higher electrical conductivity than the electrically conductive subsequent film 124. Where conductivity is depicted as σ (S/m) and thickness is depicted as τ (μm), such that σ124<σ118 and optionally τ118<τ124.

In an embodiment, the SEI 110 includes the electrically conductive first film 118, an electrically conductive second film 120, and the electrically conductive subsequent film 124. In this embodiment, the electrically conductive second film 120 is disposed directly on the electrically conductive first film 118, and the electrically conductive subsequent film 124 is disposed directly on the electrically conductive second film 120. In an embodiment, the electrically conductive subsequent film 124 is thicker than the electrically conductive first film 118, the electrically conductive second film 120 is about the same thickness as the electrically conductive first film 118. In an embodiment, the electrically conductive second film 120 has a lower electrical conductivity than the electrically conductive first film 118, but a higher electrical conductivity than the electrically conductive subsequent film 124, and the electrically conductive first film 118 has a higher electrical conductivity than the electrically conductive subsequent film 124. Where conductivity is depicted as σ, and thickness is depicted as τ, σ124<σ120<σ118 and optionally τ118≤τ120<τ124.

In an embodiment, the SEI 110 includes the electrically conductive first film 118, the electrically conductive second film 120, an electrically conductive third film 122, and the electrically conductive subsequent film 124. In this embodiment, the electrically conductive second film 120 is disposed directly on the electrically conductive first film 118, the electrically conductive third film 122 is disposed directly on the electrically conductive second film 120, and the electrically conductive subsequent film 124 is disposed directly on the electrically conductive third film 122. In an embodiment, the electrically conductive subsequent film 124 is thicker than the electrically conductive first film 118, the electrically conductive second film 120 is about the same thickness as the electrically conductive first film 118, the electrically conductive third film 122 is thicker than the electrically conductive second film 120 but thinner than the electrically conductive subsequent film 124. In an embodiment, the electrically conductive second film 120 has a lower electrical conductivity than the electrically conductive first film 118, but a higher electrical conductivity than the electrically conductive third film 122 and the electrically conductive subsequent film 124, and the third electrically conductive film 122 has a higher electrical conductivity than the electrically conductive subsequent film 124. Where conductivity is depicted as $\sigma$, and thickness is depicted as $\tau$, $\sigma 124 < \sigma 122 < \sigma 120 < \sigma 118$ and optionally $\tau 118 < \tau 120 < \tau 122 < \tau 124$. These amounts may be alternatively expressed seriatim as $\sigma N^{th} < \ldots \sigma i^{th} \ldots < \sigma 3^{rd} < \sigma 2^{nd} < \sigma 1^{st}$ and optionally $\tau 1^{st} \leq \theta 2^{nd} < \tau 3^{rd} << \ldots \tau i^{th} \ldots < \tau N^{th}$.

Reference is again made to FIG. 1 as constituted. Table 1 illustrates an embodiment that includes the SEI 110 with given thicknesses and conductivities.

TABLE 1

Self-Equalizing Interconnect

| Layer No. | Layer thickness, μm | Conductivity, S/m | Conductivity Ratio $N^{th}:1^{st}$ layer | Selected Materials |
|---|---|---|---|---|
| 118 ($1^{st}$) | 0.66 | $5.8 \times 10^7$ | 1:1 | Cu, Cu alloys |
| 120 ($2^{nd}$) | 0.66 | $1.9 \times 10^7$ | 1:3 | Brass/Al Alloys, Metal-bearing polymer, Conductive plastic |
| 122 ($3^{rd}$) | 5.3 | $4.7 \times 10^6$ | 1:12.3 | Ti, Pb, TiPb alloys, Conductive plastic, |
| 124 ($N^{th}$) | 59.0 | $5.2 \times 10^4$ | 1:1,115 | Conductive plastic, Conductive epoxy |

In this embodiment, the SEI 110 includes four layers that are stacked, electrically conductive material with selected thickness, metal conductivities, and materials. Whereas there is an increasing conductive film thickness gradient as each successive conductive film is farther from the reference plane 112 than the previous. In an embodiment, there is a decreasing conductive film electrical conductivity as each successive conductive film is farther from the reference plane 112 than the previous.

The electrically conductive first film 118 on the dielectric film 114 is the conductive layer most adjacent to the reference plane 112 and the electrically conductive first film 118 includes highest metal conductivity among the stacked film such as electrical grade copper (Cu) with a conductivity of about $5.8 \times 10^7$ S/m (Siemens/meter). In an embodiment, the electrically conductive first film 218 is silver (Ag). In an embodiment, the electrically conductive first film 218 is a CuAg alloy with Cu the majority amount. The electrical conductivity is configured to decrease beginning with the next conductive layer, i.e., the electrically conductive second film 120 and it continues to decrease until the electrically conductive subsequent film 124 exhibits the lowest electrical conductivity.

In an embodiment, the electrically conductive second film 120 includes brass. In an embodiment, the electrically conductive second film 120 includes an aluminum (Al) alloy. In an embodiment, the electrically conductive second film 120 includes a metallic polymer. In an embodiment, the electrically conductive second film 120 includes a metallic plastic. In any event for this example, electrical conductivity is about $1.9 \times 10^7$ S/m.

In an embodiment, the electrically conductive third film 122 exhibits an electrical conductivity of about $4.7 \times 10^6$ S/m. In an embodiment, the electrically conductive third film 122 is titanium (Ti) or a Ti alloy. In an embodiment, the electrically conductive third film 122 is lead (Pb) or a Pb alloy. In an embodiment, the electrically conductive third film 122 is a conductive plastic. In any event for this example, electrical conductivity, $\sigma$, of about $4.7 \times 10^6$ S/m.

In an embodiment, the electrically conductive subsequent film 124 exhibits an electrical conductivity of about $5.2 \times 10^4$ S/m. In an embodiment, the conductive subsequent film 124 is an electrically conductive plastic. In an embodiment, the conductive subsequent film 124 is an electrically conductive epoxy. In any event for this example, electrical conductivity of about $5.2 \times 10^4$ S/m.

The thickness of the stacked metal films are selected based upon targeted equalization frequencies. In this example embodiment, the thickness of the electrically conductive first film 118 is equivalent to the current concentration at skin depth at the maximum operating frequency that is 0.66 micrometers (also expressed as "micron" or μm) at 10 GHz for Cu. In this example embodiment, the thickness of the electrically conductive second film 120 is selected to be equalized at 5 GHz. The skin depth at 5 GHz is governed by the effective electrical conductivity of the first- and electrically conductive second films 118 and 120 and the effective electrical conductivity spans $\sigma 1^{st}$ and $\sigma 2^{nd}$. Consequently, the electrically conductive second film 120 thickness is $\tau 2^{nd}$, with subtraction of skin depth thickness at 5 GHz and $\tau 1^{st}$, namely 0.66 μm.

In the continuing embodiment, the electrically conductive third film 122 is selected to be equalized at 1 GHz. The skin depth at 1 GHz is governed by the effective conductivity of the first-, second- and third electrically conductive films 118, 120 and 122, respectively and spans across $\sigma 1^{st}$, $\sigma 2^{nd}$, and $\sigma 3^{rd}$. The thickness of the third electrically conductive film 122 is the subtraction of skin depth thickness at 1 GHz and $\tau 1^{st}$ and $\tau 2^{nd}$, namely 5.3 μm. Lastly, the subsequent electrically conductive film 124 is designed to be equalized at the lowest frequency i.e., 100 MHz. The skin depth at 100 MHz is governed by the effective conductivity of the first electrically conductive-second-third- and subsequent films 118, 120 and 122, respectively, and spans across $\sigma 1^{st}$, $\sigma 2^{nd}$, $\sigma 3^{rd}$ and $\sigma 4^{th}$. The thickness of the subsequent electrically conductive film 124 is the subtraction of skin depth thickness at 100 MHz and $\tau 1^{st}$, $\tau 2^{nd}$ and $\tau 3^{rd}$, namely 59 μm.

Figure 1A:
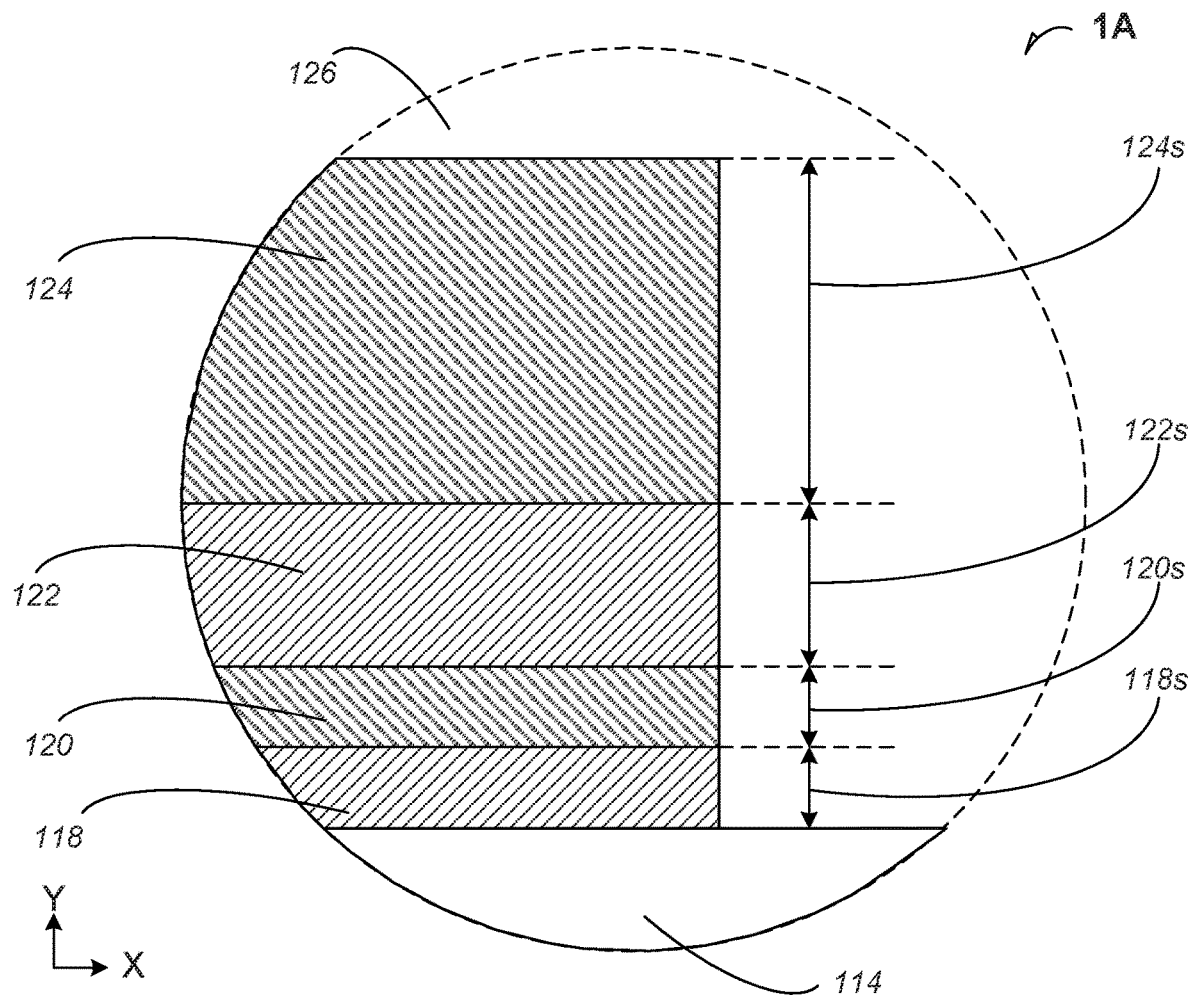
FIG. 1A is a detail section taken along the section circle 1A from FIG. 1 according to an embodiment.

FIG. 1A is a detail section taken along the section circle 1A from FIG. 1 according to an embodiment. It can be appreciated the illustrated thicknesses of the conductive layers are not necessarily to scale but are depicted as illustrated for clarity. The electrically conductive first film 118 has a thickness 118s and the electrically conductive second film 120 has a thickness 120s, and these films are about the same thickness but of differing electrical conductivity with the electrically conductive first film 118 having a higher electrical conductivity.

Although the structure depicted in FIGS. 1 and 1A show decreasing electrical conductivity paired with increasing film thickness, in an embodiment, first- to $N^{th}$ conductive films may be all of about the same thickness, within processing parameters, but they retain the seriatim decreasing electrical conductivity as set forth in this disclosure. Thus as seen in FIG. 1A, the relative thicknesses 118s, 120s, 122s, and 124s are all about 0.66 μm but they have respectively decreasing electrical conductivity.

It can now be understood that a functionally gradient continuous material may be fabricated to form an SEI that models the, e.g. four-discrete-film SEI 100 depicted in FIGS. 1 and 1A. For example, a chemical vapor deposition (CVD) process may begin by starting with an electrically conductive subsequent film type such as item 124, and CVD depositing the electrically conductive third film 122 equivalent by changing CVD inputs. For example, where the electrically conductive subsequent film 124 has the lowest-electrical conductivity material such as a conductive plastic, CVD processing is adjusted by introducing a titanium-bearing polymer to achieve the electrically conductive third film 122. Next, the electrically conductive second film 120 is made by changing from a titanium-based CVD supply material to an aluminum-based supply material. Finally, the electrically conductive first film 118 is made by turning off all sources of conductive plastic and depositing a copper-based supply material. It can now be understood the functionally gradient embodiment may also be referred to as a laminated electrically conductive film as distinct zones can be detected when dissected in cross-section.

FIG. 2A is a cross-section elevation of a package substrate during fabrication according to an embodiment. A carrier sheet 201 is used to adhere an $N^{th}$ or electrically conductive subsequent film; in this embodiment, the electrically conductive subsequent film 224 is a fourth film. In an embodiment, the carrier sheet 201 is a thermal-release film. In an embodiment, the carrier sheet 201 is a light-cure release film such as an ultraviolet light-release film. This processing embodiment includes four conductive films. According to selected embodiments, the subsequent ($N^{th}$) conductive film 224 has the lowest electrical conductivity of all the conductive films that will be used to make a self-equalizing interconnect (SEI). Depending upon the materials selected for a given embodiment, the electrically conductive subsequent film 224 may be supplied as a pre-formed material. Depending upon the materials selected for a given embodiment, the electrically conductive subsequent film 224 may be formed in situ upon the carrier sheet 201 such as by spray deposition such as an electrically conductive plastic. In an embodiment, the electrically conductive subsequent film 224 is an electrically conductive epoxy. In an embodiment, the electrically conductive subsequent film 224 is the thickest of all the conductive films that will be used to make a self-equalizing interconnect.

FIG. 2B is a cross-section elevation of the package substrate depicted in FIG. 2A after further processing according to an embodiment. This processing embodiment includes four conductive films. The electrically conductive subsequent film 224 has been overlaid with an electrically conductive third film 222. Depending upon the materials selected for a given embodiment, the electrically conductive third film 222 may be supplied as a pre-formed material such as a titanium foil. In an embodiment, a titanium film may be formed by electroplating onto the electrically conductive subsequent film 224. In an embodiment, the electrically conductive third film 222 is a lead foil. In an embodiment, a leaden film may be formed by electroplating onto the electrically conductive subsequent film 224. In an embodiment, the electrically conductive subsequent film 224 is the thickest of all the conductive films that will be used to make a self-equalizing interconnect, and the electrically conductive third film 222 is the second thickest.

FIG. 2C is a cross-section elevation of the package substrate depicted in FIG. 2B after further processing according to an embodiment. This processing embodiment includes four conductive films. The electrically conductive subsequent film 224 has been overlaid with the electrically conductive third film 222 and an electrically conductive second film 220 has been formed on the electrically conductive third film 222. Depending upon the materials selected for a given embodiment, the electrically conductive second film 220 may be supplied as a pre-formed material such as a brass foil. In an embodiment, the film 220 is formed by electroplating brass from a colloid solution. In an embodiment, the electrically conductive second film 220 is an aluminum material such as substantially pure Al (greater than 99.99 percent pure). In an embodiment, an aluminum alloy is formed by electroplating onto the conductive third film 222. In an embodiment, the electrically conductive second film 220 is an electrically conductive metallic polymer. In an embodiment, the electrically conductive second film 220 is an electrically conductive plastic. In an embodiment, the electrically conductive subsequent film 224 is the thickest of all the conductive films that will be used to make a self-equalizing interconnect, the electrically conductive third film 222 is the second thickest, and the electrically conductive second film 220 is thinner than the electrically conductive third film 222.

FIG. 2D is a cross-section elevation of the package substrate depicted in FIG. 2C after further processing according to an embodiment. This processing embodiment includes four conductive films. The electrically conductive subsequent film 224 has been overlaid with the electrically conductive third film 222, the electrically conductive second film 220, and an electrically conductive first film 218 has been formed on the electrically conductive second film 220. Depending upon the materials selected for a given embodiment, the electrically conductive first film 218 may be supplied as a pre-formed material such as a copper foil, or a copper film may be formed by electroplating onto the conductive second film 220. In an embodiment, the electrically conductive subsequent film 224 is the thickest of all the conductive films that will be used to make a self-equalizing interconnect, the electrically conductive third film 222 is the second thickest, the electrically conductive second film 220 is thinner than the electrically conductive third film 222, and the electrically conductive first film 218 is thinner than- or substantially the same thickness as the electrically conductive second film 220.

It can be seen that a precursor self-equalizing interconnect trace stack 209 is formed from the four conductive films 224, 222, 220 and 218.

FIG. 2E is a cross section elevation of the package substrate depicted in FIG. 2D after further processing according to an embodiment. The respective subsequent-third, second and electrically conductive first films 224, 222, 220 and 218 have been released from the carrier 201 (see FIG. 2D) and the precursor SEI trace stack 209 is inverted in the Y-dimension compared to previous illustrated embodiments.

A reference plane 212 is to be sandwiched between a proximal dielectric film 214 and a distal dielectric film 213. In an embodiment, the proximal- and distal dielectric films 214 and 213 are a material such as a polyimide in an example embodiment. In an embodiment, the reference plane 212 is copper. The reference plane 212 and the proximal- and distal dielectric films 214 and 213 to be disposed upon a rigid carrier 215 such as a carrier-rigid paper.

FIG. 2F is a cross section elevation of the package substrate depicted in FIG. 2E after further processing according to an embodiment. An SEI precursor assembly 200 includes the precursor SEI trace stack 209, which has been assembled onto a consolidated substrate 211. The consolidated substrate 211 includes the rigid carrier 215 and proximal- and distal dielectric films 214 and 213 sandwiching the reference plane 212 illustrated in FIG. 2E. In an embodiment, lamination of the SEI precursor assembly 200 is done by a thermal pressing process under conditions sufficient to make a useful package substrate precursor assembly 200.

Figure 2G:
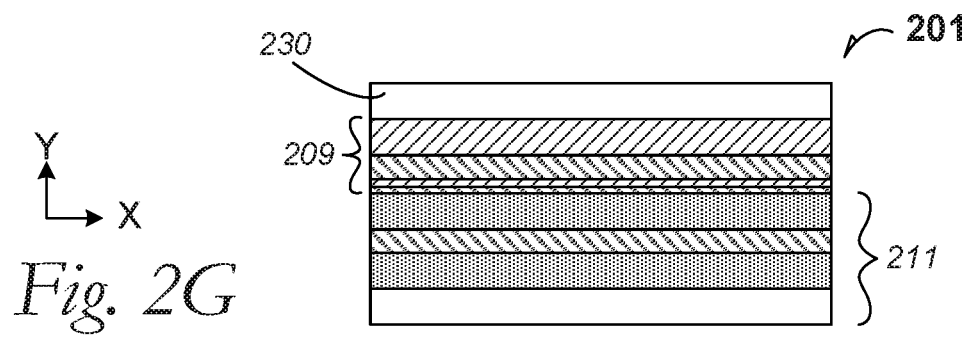

FIG. 2G is a cross section elevation of the package substrate depicted in FIG. 2F after further processing according to an embodiment. The SEI precursor assembly 201 depicted in FIG. 2G has been altered from the SEI precursor assembly 200 in FIG. 2F by forming a dry film resist 230 upon the SEI trace stack 209 (at the electrically conductive subsequent film, e.g. film 224).

Figure 2H:
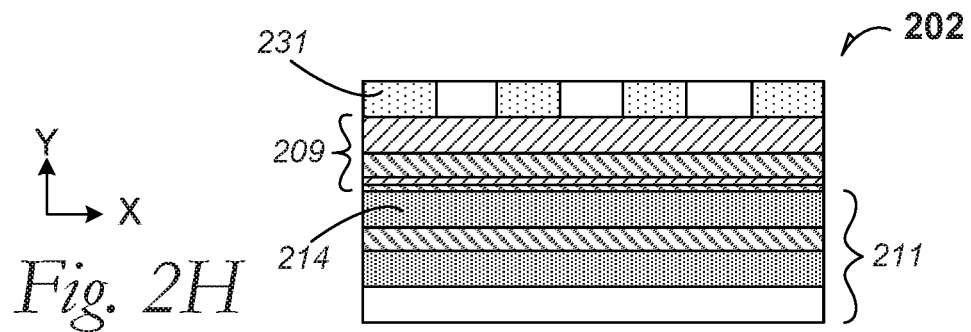

FIG. 2H is a cross section elevation of the package substrate depicted in FIG. 2G after further processing according to an embodiment. The SEI precursor assembly 202 depicted in FIG. 2H has been altered from the SEI precursor assembly 201 in FIG. 2G by patterning and curing the dry film resist 230 to form a pattened dry film resist 231. As illustrated the patterned dry film resist 231 has unexposed regions shown with a patten, and cured regions shown solid. Thereafter, the unexposed regions are removed and a dry film etch is carried out that is selective to stop on the proximal dielectric 214.

Figure 2K:
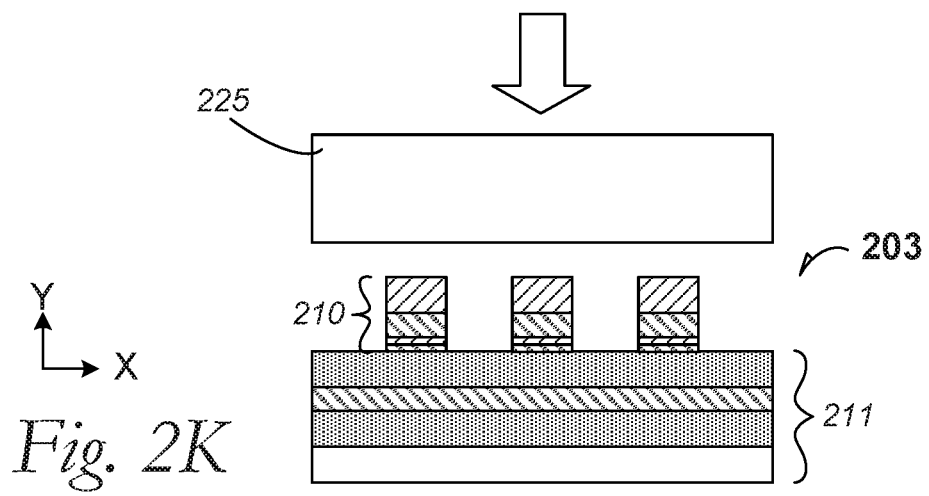

FIG. 2K is a cross section elevation of the package substrate depicted in FIG. 2G after further processing according to an embodiment. Reference numbers 2I, 2J and 2L are not used. The SEI precursor assembly 203 depicts further processing after dry etching. After dry etching using the patterned dry film resist 231, a self-equalizing interconnect 210 is formed including in this embodiment, a four-film interconnect structure.

In an embodiment, a solder resist precursor 225 is shown with a directional arrow indicating formation of the solder resist precursor 225 onto the SEI precursor assembly 203 in order to achieve a structure similar to the self-equalizing interconnect 100 depicted in FIG. 1.

Figure 2M:
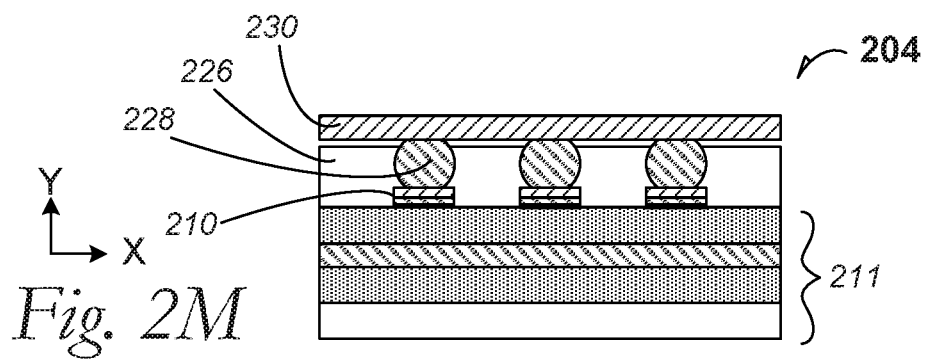

FIG. 2M is a cross section elevation of the package substrate depicted in FIG. 2K after further processing according to an embodiment. Reference numbers 2I, 2J and 2L are not used. The SEI precursor assembly 204 illustrates electrical connection such as is useful for a flexible printed circuit (FPC) device. The self-equalizing interconnect 210 has heretofore been depicted in exaggerated Y-dimension for illustrative purposes, and although it appears to be flatter than previously illustrated, it is not necessarily depicted to scale for any given embodiment. The SEI 210 has been covered with the solder resist 226, after which the solder resist 226 has been opened to expose the SEI 210, and an electrical bump 228 has been formed onto the SEI 210. In an embodiment, the electrical bump 228 is a lead-free solder. In an embodiment, the electrical bump 228 is a lead-containing solder. In an embodiment, the electrical bump 228 is formed from nano-sized copper powder under conditions to achieve a copper electrical bump 228 with reflowed metal grains that are in a range from about 0.5 µm average grain size to about 2.0 µm. In an embodiment, the electrical bump 228 is a metallic pillar such as a copper pillar.

After further processing, the SEI 210 has been placed into electrical communication with a connector 230.

FIGS. 3A and 3B are graphs illustrating comparative insertion loss with respect to skin effect as a function of frequency according to an embodiment.

FIG. 3A is an eye diagram 300 that illustrates signal integrity for a single-wire interconnect that runs at 20 GT/sec over a 15-inch channel length. The eye diagram 300 represents an electrical performance of a single-wire signal line for comparison to disclosed embodiments. Impedance mismatch is a source of reflection noise in a high-speed I/O channel, and reduced impedance mismatch translates to an improvement in eye margin. Impedance mismatch affects a signal amplitude at a receiving end of signal line. The resulting signal integrity can be represented by the eye diagram. Essentially, the larger the eye opening, i.e., the diamond-shaped space bounded between the data traces as graphed, the more easily a bit or sequence of bits may be distinguished. Thus, the eye diagram indicates a quality of signal and an efficacy of a high-speed I/O channel In FIG. 3A, the amplitude of data integrity is plotted against a unit interval (UI) based upon a normalized signal from node to node. In FIG. 3B, the amplitude of data integrity can be seen quantitatively to be larger than that seen in FIG. 3A, over the same UI. Evaluation of the two eye diagrams illustrates improved signal integrity, seen in FIG. 3B where a self-equalizing interconnect embodiment includes the first-through fourth conductive film embodiment illustrated and described in FIGS. 1 and 1A.

FIGS. 4A and 4B are graphs illustrating comparative insertion loss with respect to skin effect as a function of frequency according to an embodiment. FIG. 4A is an eye diagram 400 that illustrates signal integrity for a single-wire interconnect that runs at 16 GT/sec over a 20-inch channel length. The eye diagram indicates a quality of signal and an efficacy of a high-speed I/O channel. In FIG. 4A, the amplitude of data integrity is plotted against a unit interval (UI) based upon a normalized signal from node to node. In FIG. 4B, the amplitude of data integrity can be seen quantitatively to be larger than that seen in FIG. 4A, over the same UI. Evaluation of the two eye diagrams illustrates improved signal integrity, seen in FIG. 4B where a self-equalizing interconnect embodiment includes the first-through fourth conductive film embodiment illustrated and described in FIGS. 1 and 1A.

Figure 5:
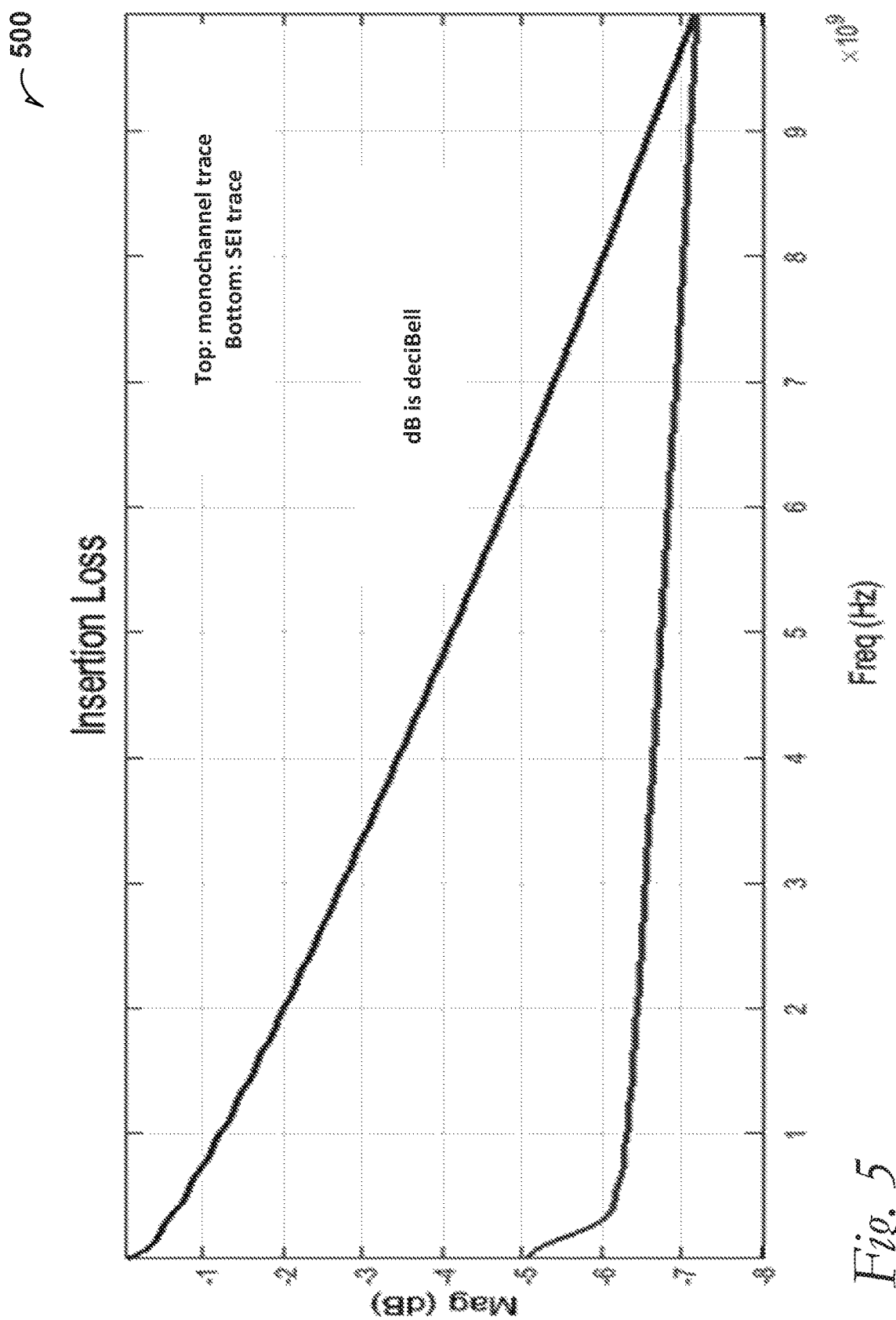
FIG. 5 illustrates insertion loss change of the inventive self-equalized interconnect compared to a mono-channel trace according to an embodiment.

FIG. 5 is a comparative plot of the magnitude of insertion loss measured in Decibel, dB plotted over frequency range from zero- to 10 GHz. According to a useful embodiment, the monochannel trace shows variability that is improved by the self-equalizing interconnect embodiment illustrated and described in FIGS. 1 and 1A. Usefully, signal integrity degrades significantly less with the SEI embodiment over this frequency range, which allows for higher reliability and a more stable design- and performance window.

Figure 6:
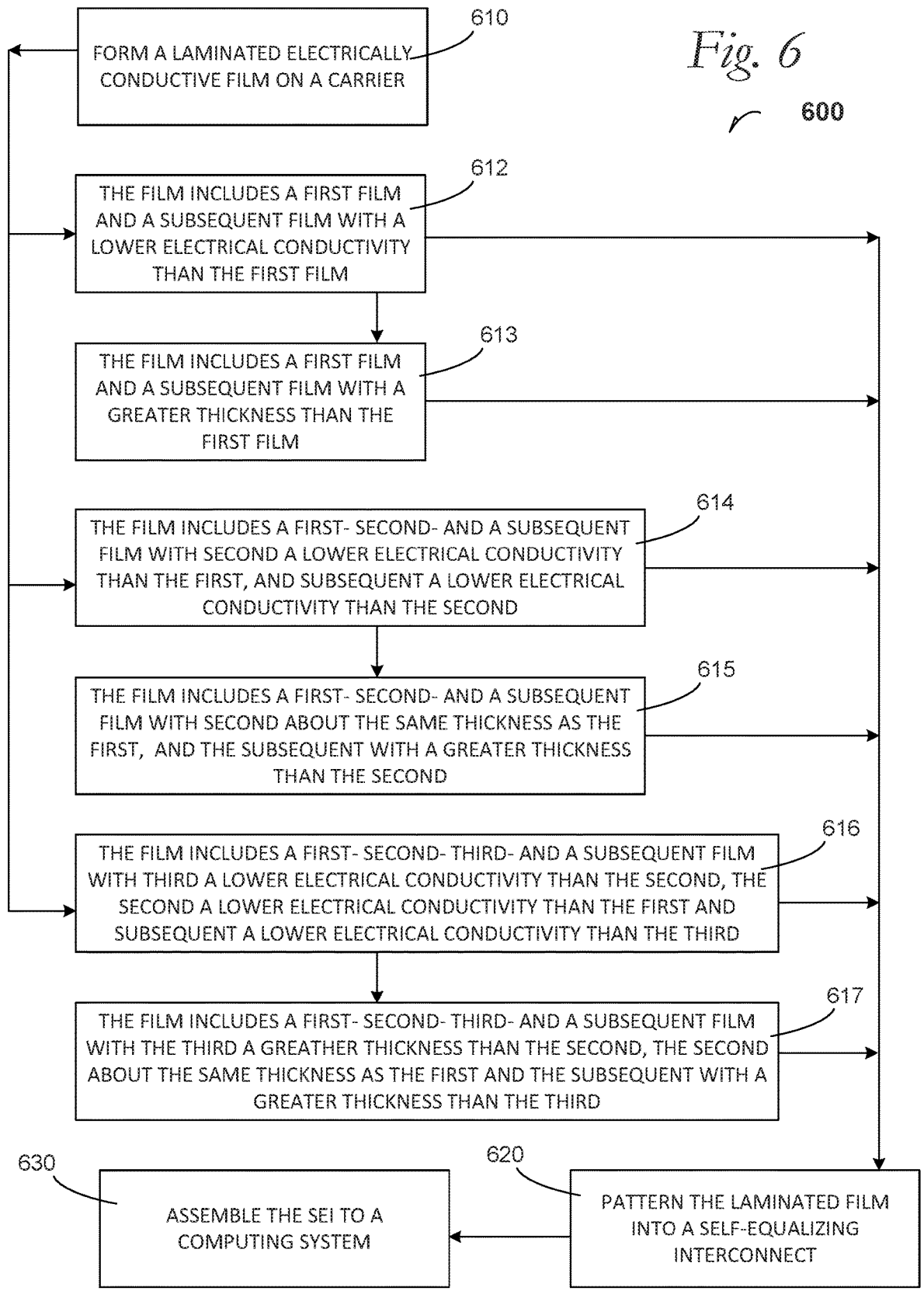
FIG. 6 is a process flow diagram depicting processing methods according to several embodiments.

FIG. 6 is a process flow diagram 600 according to several embodiments.

At 610, the process includes forming a laminated electrically conducting film on a carrier. In an embodiment, discrete electrically conductive films are formed. In an embodiment, a functionally gradient electrically conductive film is formed.

At 612, the process includes forming just the electrically conductive first- and subsequent films 118 and 124.

At 613, the process includes forming the two films with differing film thicknesses.

At 614, the process includes forming the electrically conductive first-second- and subsequent films 118, 120 and 124.

At 615, the process includes forming the three films with differing thicknesses where the first- and second films may be about the same thickness, but they are differing in film thickness from the electrically conductive subsequent film.

At 616, the process includes forming the electrically conductive first-second-third- and subsequent films 118, 120, 122 and 124.

At 617, the process includes forming the four films with differing thicknesses where the first- and second films may be about the same thickness, but they are differing in film thickness from the third film, which is thicker, and the electrically conductive subsequent film is thicker than the third film.

At 620, the process includes patterning the laminated film into a self-equalizing interconnect such as by dry film etching as set forth in this disclosure.

At 630, the process includes assembling the self-equalizing interconnect to a computing system as will be described hereinafter.

Figure 7:
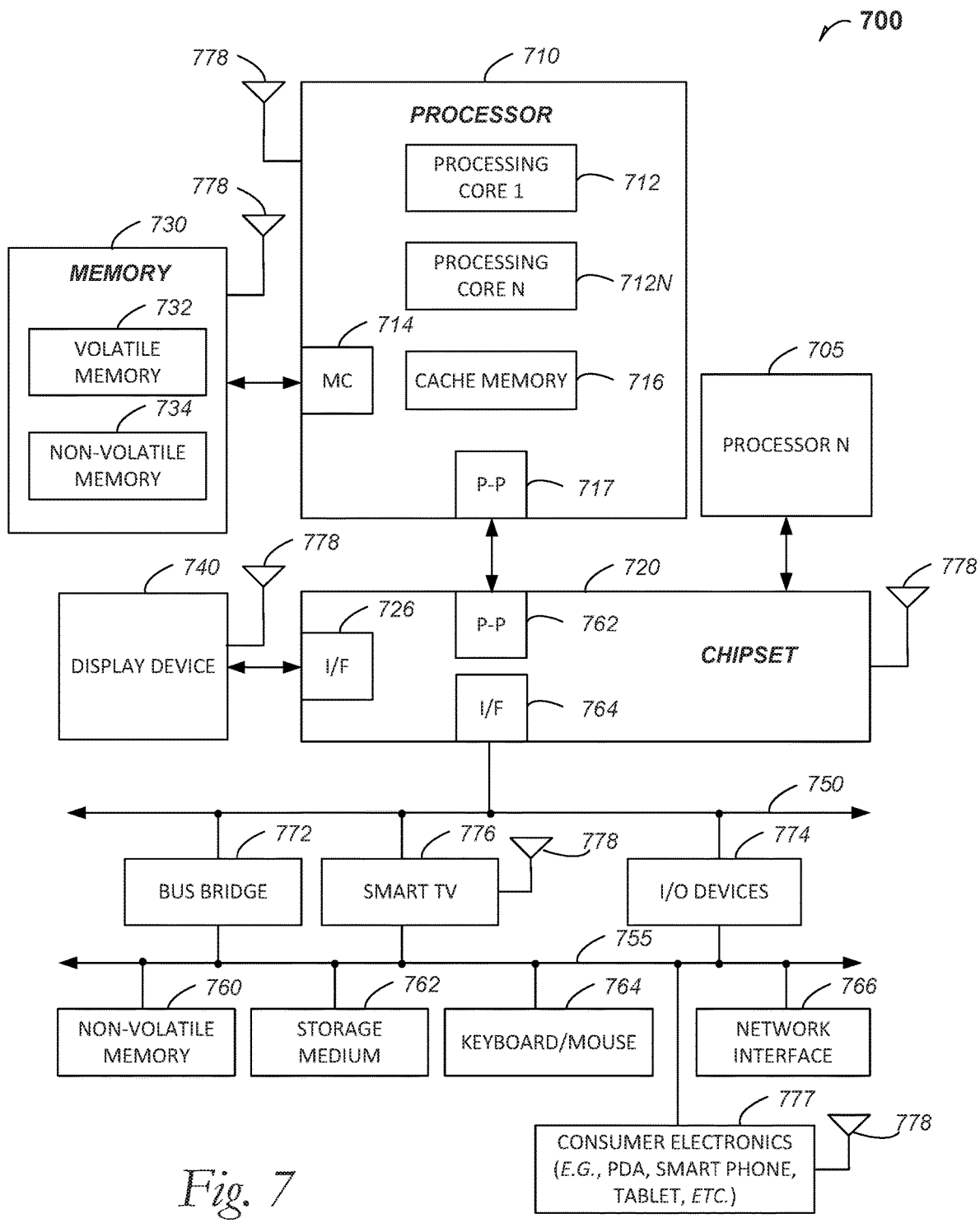
FIG. 7 is a block diagram of a computing device suitable for use with embodiments.

FIG. 7 is a computing system 700 according to an embodiment. FIG. 7 illustrates a system level diagram, according to one embodiment of the invention. For instance, FIG. 7 depicts an example of a microelectronic device that includes an SEI embodiment on a substrate such as a flexible substrate as described in the present disclosure.

FIG. 7 is included to show an example of a higher level device application for the present invention. In one embodiment, a system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, the SiP device system 700 is a system on a chip (SOC) system.

In an embodiment, the processor 710 has one or more processing cores 712 and 712N, where 712N represents the $N^{th}$ processor core inside processor 710 where N is a positive integer. In an embodiment, the electronic device system 700 using an SEI interconnect includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the SiP device system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using a semiconductive bridge as set forth in this disclosure. The chipset 720 enables the processor 710 to connect to other elements in the SiP device system 700. In an embodiment, interfaces 717 and 722 operate in accordance with a PtP communication protocol such as the Intel® QuickPath Interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In and embodiment, the processor 710 and the chipset 720 are merged into a single SOC. Additionally, the chipset 720 connects to one or more buses 750 and 755 that interconnect various elements 774, 760, 762, 764, and 766. Buses 750 and 755 may be interconnected together via a bus bridge 772. In an embodiment, the chipset 720 couples with a non-volatile memory 760, a mass storage device(s) 662, a keyboard/mouse 664, and a network interface 766 by way of at least one of the interface 724 and 704, the smart TV 776, and the consumer electronics 777, etc.

In and embodiment, the mass storage device 762 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the SiP device system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

To illustrate the self-equalizing interconnect embodiments and methods disclosed herein, a non-limiting list of examples is provided herein:

Example 1 is a self-equalizing interconnect comprising: an electrically conductive first film disposed on a dielectric layer, wherein the dielectric layer separates the electrically conductive first film from a reference plane; and an electrically conductive subsequent film disposed above the electrically conductive first film, wherein the electrically conductive first film has a first electrical conductivity and the electrically conductive subsequent film has a subsequent electrical conductivity that is lower than the first electrical conductivity, and wherein the self-equalizing interconnect exhibits a signal integrity less than 1 dB over the range from about 0.5 GHz to 10 GHz.

In Example 2, the subject matter of Example 1 optionally includes wherein the electrically conductive subsequent film is thicker than the electrically conductive first film.

In Example 3, the subject matter of any one or more of Examples 1-2 optionally include an electrically conductive second film disposed on and contacting the electrically conductive first film, wherein the electrically conductive second film has a second electrical conductivity that is lower than the first electrical conductivity and higher than the subsequent electrical conductivity.

In Example 4, the subject matter of Example 3 optionally includes wherein the electrically conductive second film is about the same thickness as the electrically conductive first film and the electrically conductive subsequent film is thicker than the electrically conductive second film.

In Example 5, the subject matter of any one or more of Examples 1-4 optionally include an electrically conductive second film disposed on and contacting the electrically conductive first film; an electrically conductive third film disposed on and contacting the electrically conductive second film, wherein the electrically conductive third film has a third electrical conductivity that is lower than the electrically conductive second film, the electrically conductive second film has a second electrical conductivity that is lower than the first electrical conductivity and higher than the subsequent electrical conductivity. In Example 6, the subject matter of any one or more of Examples 4-5 optionally include wherein the electrically conductive third film is thicker than the electrically conductive second film, the electrically conductive second film is about the same thickness as the electrically conductive first film and the electrically conductive subsequent film is thicker than the electrically conductive third film.

In Example 7, the subject matter of any one or more of Examples 1-6 optionally include wherein the electrically conductive first film exhibits a conductivity of about $5.8 \times 10^7$ S/m, further including: an electrically conductive second film disposed on and contacting the electrically conductive first film, wherein the electrically conductive second film exhibits a conductivity of about $1.9 \times 10^7$ S/m; an electrically conductive third film disposed on and contacting the electrically conductive second film, wherein the electrically conductive third film exhibits a conductivity of about $4.7 \times 10^6$ S/m; and wherein the electrically conductive subsequent film exhibits a conductivity of about $5.2 \times 10^4$ S/m.

In Example 8, the subject matter of Example 7 optionally includes wherein the electrically conductive first film has a thickness of about 0.66 μm, the electrically conductive second film has a thickness of about 0.66 μm, the electrically conductive third film has a thickness of about 5.3 μm, and the electrically conductive subsequent film has a thickness of about 59.0 μm.

In Example 9, the subject matter of any one or more of Examples 7-8 optionally include wherein the electrically conductive first film has a first thickness, the electrically conductive second film has the first thickness, the electrically conductive third film has a thickness of about 8.03 times the first thickness, and the electrically conductive subsequent film has a thickness of about 893.9 times the first thickness.

In Example 10, the subject matter of any one or more of Examples 7-9 optionally include wherein the electrically conductive first film is made from a material selected from the group consisting of copper, silver, and combinations thereof, and the electrically conductive first film exhibits a conductivity of about $5.8 \times 10^7$ S/m, further including: an electrically conductive second film disposed on and contacting the electrically conductive first film, wherein the electrically conductive second film is made from a material selected from the group consisting of brass, aluminum, aluminum alloys, metallic polymers, and plastics, and combinations thereof, and, and wherein the electrically conductive second film exhibits a conductivity of about $1.9 \times 10^7$ S/m; an electrically conductive third film disposed on and contacting the electrically conductive second film, wherein the electrically conductive third film is made from a material selected from the group consisting of titanium, lead, conductive plastics and combinations thereof, and wherein the electrically conductive third film exhibits a conductivity of about $4.7 \times 10^6$ S/m; and wherein the electrically conductive subsequent film is made from a material selected from the group consisting of conductive plastics, epoxies and combinations thereof, and exhibits a conductivity of about $5.2 \times 10^4$ S/m.

Example 11 is a multiple-layer connector including a flexible self-equalized interconnect, comprising: an electrically conductive first film with a first electrical conductivity, disposed on a dielectric layer, wherein the dielectric layer separates the electrically conductive first film from a reference plane, and wherein the electrically conductive first film is made from a material selected from the group consisting of copper, silver, and combinations thereof; an electrically conductive second film disposed on and contacting the electrically conductive first film, wherein the electrically conductive second film is made from a material selected from the group consisting of brass, aluminum, aluminum alloys, metallic polymers, and plastics, and combinations thereof, and wherein the electrically conductive second film has a second electrical conductivity lower than the first electrical conductivity; an electrically conductive third film disposed on and contacting the electrically conductive second film, wherein the electrically conductive third film is made from a material selected from the group consisting of titanium, lead, conductive plastics and combinations thereof, and wherein the electrically conductive third film has a third electrical conductivity lower than the second electrical conductivity; an electrically conductive subsequent film disposed above the electrically conductive third film, wherein the electrically conductive subsequent film is made from a material selected from the group consisting of conductive plastics, epoxies and combinations thereof, and wherein the electrically conductive subsequent film has a subsequent electrical conductivity lower than the third electrical conductivity; and wherein the multiple-layer connector is part of a device selected from the group consisting of a flex cable, a high-speed interconnect, a semiconductive device package substrate, and a flexible printed wiring board.

In Example 12, the subject matter of Example 11 optionally includes wherein the self-equalizing interconnect exhibits a signal integrity less than 1 dB over the range from about 0.5 GHz to 10 GHz.

In Example 13, the subject matter of any one or more of Examples 11-12 optionally include wherein the electrically conductive first film has a thickness of about 0.66 μm, the electrically conductive second film has a thickness of about 0.66 μm, the electrically conductive third film has a thickness of about 5.3 μm, and the electrically conductive subsequent film has a thickness of about 59.0 μm.

Example 14 is a method of forming a self-equalizing interconnect trace on a package substrate, comprising: forming an electrically conductive subsequent film on a carrier sheet; forming an electrically conductive first film above the electrically conductive subsequent film; releasing the first- and electrically conductive subsequent films from the carrier sheet; assembling the first- and electrically conductive subsequent films to a reference plane that is disposed between proximal- and distal dielectric films, wherein the distal dielectric film is assembled to a rigid carrier, wherein assembling the first- and electrically conductive subsequent films is carried out by thermal- and pressure bonding; patterning a dry film resist on the electrically conductive subsequent film; etching through the dry film resist to achieve a self-equalized interconnect trace on the proximal dielectric film; and forming solder resist layer over the self-equalized interconnect trace.

In Example 15, the subject matter of Example 14 optionally includes assembling the self-equalizing interconnect in a substrate to a semiconductive device.

In Example 16, the subject matter of any one or more of Examples 14-15 optionally include forming an electrically conductive second film on and in contact with the electrically conductive first film, followed by forming the electrically conductive subsequent film.

In Example 17, the subject matter of any one or more of Examples 13-16 optionally include assembling the self-equalizing interconnect in a substrate to a semiconductive device.

In Example 18, the subject matter of any one or more of Examples 14-17 optionally include wherein further including: forming an electrically conductive second film on and in contact with the electrically conductive first film; forming an electrically conductive third film on an in contact with the electrically conductive second film, followed by forming the electrically conductive subsequent film on an in contact with the electrically conductive third film.

In Example 19, the subject matter of Example 18 optionally includes assembling the self-equalizing interconnect in a substrate to a semiconductive device.

In Example 20, the subject matter of any one or more of Examples 14-19 optionally include wherein the electrically conductive first film is made from a material selected from the group consisting of copper, silver, and combinations thereof, and the electrically conductive first film exhibits a conductivity of about $5.8 \times 10^7$ S/m, further including: forming an electrically conductive second film on and in contact with the electrically conductive first film, wherein the electrically conductive second film is made from a material selected from the group consisting of brass, aluminum, aluminum alloys, metallic polymers, and plastics, and combinations thereof, and, and wherein the electrically conductive second film exhibits a conductivity of about $1.9 \times 10^7$ S/m; forming an electrically conductive third film on and in contact with the electrically conductive second film, wherein the electrically conductive third film is made from a material selected from the group consisting of titanium, lead, conductive plastics and combinations thereof, and wherein the electrically conductive third film exhibits a conductivity of about $4.7 \times 10^6$ S/m; and wherein the electrically conductive subsequent film is made from a material selected from the group consisting of conductive plastics, epoxies and combinations thereof, and exhibits a conductivity of about $5.2 \times 10^4$ S/m.

In Example 21, the subject matter of Example 20 optionally includes assembling the self-equalizing interconnect in a substrate to a semiconductive device.

Example 22 is a system in package computing system including a multiple-layer connector including a flexible self-equalized interconnect, comprising: an electrically conductive first film with a first electrical conductivity, disposed on a dielectric layer, wherein the dielectric layer separates the electrically conductive first film from a reference plane, wherein the electrically conductive first film has a thickness of about 0.66 μm, and wherein the electrically conductive first film is made from a material selected from the group consisting of copper, silver, and combinations thereof; an electrically conductive second film disposed on and contacting the electrically conductive first film, wherein the electrically conductive second film has a thickness of about 0.66 μm, wherein the electrically conductive second film is made from a material selected from the group consisting of brass, aluminum, aluminum alloys, metallic polymers, and plastics, and combinations thereof, and wherein the electrically conductive second film has a second electrical conductivity lower than the first electrical conductivity; an electrically conductive third film disposed on and contacting the electrically conductive second film, wherein the electrically conductive third film has a thickness of about 5.3 μm, wherein the electrically conductive third film is made from a material selected from the group consisting of titanium, lead, conductive plastics and combinations thereof, and wherein the electrically conductive third film has a third electrical conductivity lower than the second electrical conductivity; an electrically conductive subsequent film disposed above the electrically conductive third film, wherein the electrically conductive subsequent film has a thickness of about 59.0 μm, wherein the electrically conductive subsequent film is made from a material selected from the group consisting of conductive plastics, epoxies and combinations thereof, and wherein the electrically conductive subsequent film has a subsequent electrical conductivity lower than the third electrical conductivity; wherein the multiple-layer connector is part of a device in the computing system selected from the group consisting of a flex cable, a high-speed interconnect, a semiconductive device package substrate, and a flexible printed wiring board; and wherein the system in package device is part of a chipset that uses a processor and a memory.

In Example 23, the subject matter of any one or more of Examples 20-22 optionally include wherein the self-equalizing interconnect exhibits a signal integrity less than 1 dB over the range from about 0.5 GHz to 10 GHz.

In Example 24, the subject matter of any one or more of Examples 20-23 optionally include wherein the system in package device is coupled to a display device.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A self-equalizing interconnect comprising:
   an electrically conductive first film disposed on a dielectric layer, wherein the dielectric layer separates the electrically conductive first film from a reference plane; and
   an electrically conductive subsequent film disposed above the electrically conductive first film, wherein the electrically conductive first film has a first electrical conductivity and the electrically conductive subsequent film has a subsequent electrical conductivity that is lower than the first electrical conductivity, and wherein the self-equalizing interconnect exhibits a signal integrity less than 1 dB over the range from about 0.5 GHz to 10 GHz.

2. The self-equalizing interconnect of claim 1, wherein the electrically conductive subsequent film is thicker than the electrically conductive first film.

3. The self-equalizing interconnect of claim 1, further including:
   an electrically conductive second film disposed on and contacting the electrically conductive first film, wherein the electrically conductive second film has a second electrical conductivity that is lower than the first electrical conductivity and higher than the subsequent electrical conductivity.

4. The self-equalizing interconnect of claim 3, wherein the electrically conductive second film is about the same thickness as the electrically conductive first film and the electrically conductive subsequent film is thicker than the electrically conductive second film.

5. The self-equalizing interconnect of claim 4, wherein the electrically conductive third film is thicker than the electrically conductive second film, the electrically conductive second film is about the same thickness as the electrically conductive first film and the electrically conductive subsequent film is thicker than the electrically conductive third film.

6. The self-equalizing interconnect of claim 1, further including:
   an electrically conductive second film disposed on and contacting the electrically conductive first film;
   an electrically conductive third film disposed on and contacting the electrically conductive second film, wherein the electrically conductive third film has a third electrical conductivity that is lower than the electrically conductive second film, the electrically conductive second film has a second electrical conductivity that is lower than the first electrical conductivity and higher than the subsequent electrical conductivity.

7. The self-equalizing interconnect of claim 1, wherein the electrically conductive first film exhibits a conductivity of about $5.8 \times 10^7$ S/m, further including:
   an electrically conductive second film disposed on and contacting the electrically conductive first film, wherein the electrically conductive second film exhibits a conductivity of about $1.9 \times 10^7$ S/m;
   an electrically conductive third film disposed on and contacting the electrically conductive second film, wherein the electrically conductive third film exhibits a conductivity of about $4.7 \times 10^6$ S/m; and
   wherein the electrically conductive subsequent film exhibits a conductivity of about $5.2 \times 10^4$ S/m.

8. The self-equalizing interconnect of claim 7, wherein the electrically conductive first film has a thickness of about 0.66 μm, the electrically conductive second film has a thickness of about 0.66 μm, the electrically conductive third film has a thickness of about 5.3 pin, and the electrically conductive subsequent film has a thickness of about 59.0 μm.

9. The self-equalizing interconnect of claim 7, wherein the electrically conductive first film has a first thickness, the electrically conductive second film has the first thickness, the electrically conductive third film has a thickness of about 8.03 times the first thickness, and the electrically conductive subsequent film has a thickness of about 893.9 times the first thickness.

10. The self-equalizing interconnect of claim 7, wherein the electrically conductive first film is made from a material selected from the group consisting of copper, silver, and combinations thereof, and the electrically conductive first film exhibits a conductivity of about $5.8 \times 1.0^7$ S/m, further including:
 an electrically conductive second film disposed on and contacting the electrically conductive first film, wherein the electrically conductive second film is made from a material selected from the group consisting of brass, aluminum, aluminum alloys, metallic polymers, and plastics, and combinations thereof, and, and wherein the electrically conductive second film exhibits a conductivity of about $1.9 \times 10^7$ S/m;
 an electrically conductive third film disposed on and contacting the electrically conductive second film, wherein the electrically conductive third film is made from a material selected from the group consisting of titanium, lead, conductive plastics and combinations thereof, and wherein the electrically conductive third film exhibits a conductivity of about $4.7 \times 10^6$ S/m; and
 wherein the electrically conductive subsequent film is made from a material selected from the group consisting of conductive plastics, epoxies and combinations thereof, and exhibits a conductivity of about $5.2 \times 10^4$ S/m.

11. A multiple-layer connector including a flexible self-equalized interconnect, comprising:
 an electrically conductive first film with a first electrical conductivity, disposed on a dielectric layer, wherein the dielectric layer separates the electrically conductive first film from a reference plane, and wherein the electrically conductive first film is made from a material selected from the group consisting of copper, silver, and combinations thereof;
 an electrically conductive second film disposed on and contacting the electrically conductive first film, wherein the electrically conductive second film is made from a material selected from the group consisting of brass, aluminum, aluminum alloys, metallic polymers, and plastics, and combinations thereof, and wherein the electrically conductive second film has a second electrical conductivity lower than the first electrical conductivity;
 an electrically conductive third film disposed on and contacting the electrically conductive second film, wherein the electrically conductive third film is made from a material selected from the group consisting of titanium, lead, conductive plastics and combinations thereof, and wherein the electrically conductive third film has a third electrical conductivity lower than the second electrical conductivity;
 an electrically conductive subsequent film disposed above the electrically conductive third film, wherein the electrically conductive subsequent film is made from a material selected from the group consisting of conductive plastics, epoxies and combinations thereof, and wherein the electrically conductive subsequent film has a subsequent electrical conductivity lower than the third electrical conductivity; and
 wherein the multiple-layer connector is part of a device selected from the group consisting of a flex cable, a high-speed interconnect, a semiconductive device package substrate, and a flexible printed wiring board.

12. The multiple-layer connector including a flexible self-equalized interconnect of claim 11, wherein the self-equalizing interconnect exhibits a signal integrity less than 1 dB over the range from about 0.5 GHz to 10 GHz.

13. The multiple-layer connector including a flexible self-equalized interconnect of claim 11, wherein the electrically conductive first film has a thickness of about 0.66 μm, the electrically conductive second film has a thickness of about 0.66 μm, the electrically conductive third film has a thickness of about 5.3 μm, and the electrically conductive subsequent film has a thickness of about 59.0 μm.

14. A method of forming a self-equalizing interconnect trace on a package substrate, comprising:
 forming an electrically conductive subsequent film on a carrier sheet;
 forming an electrically conductive first film above the electrically conductive subsequent film;
 releasing the first- and electrically conductive subsequent films from the carrier sheet;
 assembling the first- and electrically conductive subsequent films to a reference plane that is disposed between proximal- and distal dielectric films, wherein the distal dielectric film is assembled to a rigid carrier, wherein assembling the first- and electrically conductive subsequent films is carried out by thermal- and pressure bonding;
 patterning a dry film resist on the electrically conductive subsequent film;
 etching through the dry film resist to achieve a self-equalized interconnect trace on the proximal dielectric film; and
 forming solder resist layer over the self-equalized interconnect trace.

15. The method of claim 14, further including assembling the self-equalizing interconnect in a substrate to a semiconductive device.

16. The method of claim 14, further including forming an electrically, conductive second film on and in contact with the electrically conductive first film, after forming the electrically conductive subsequent film.

17. The method of claim 14, further including assembling the self-equalizing interconnect in a substrate to a semiconductive device.

18. The method of claim 14, wherein further including:
 forming an electrically conductive second film on and in contact with the electrically conductive first film;
 forming an electrically conductive third film on an in contact with the electrically conductive second film, after forming the electrically conductive subsequent film.

19. The method of claim 18, further including assembling the self-equalizing interconnect in a substrate to a semiconductive device.

20. The method of claim 14, wherein the electrically conductive first film is made from a material selected from the group consisting of copper, silver, and combinations thereof, and the electrically conductive first film exhibits a conductivity of about $5.8 \times 10^7$ S/m, further including:

forming an electrically conductive second film on and in contact with the electrically conductive first film, wherein the electrically conductive second film is made from a material selected from the group consisting of brass, aluminum, aluminum alloys, metallic polymers, and plastics, and combinations thereof, and, and wherein the electrically conductive second filth exhibits a conductivity of about $1.9 \times 10^7$ S/m;

forming an electrically conductive third film on and in contact with the electrically conductive second film, wherein the electrically conductive third film is made from a material selected from the group consisting of titanium, lead, conductive plastics and combinations thereof, and wherein the electrically conductive third film exhibits a conductivity of about $4.7 \times 10^6$ S/m; and wherein the electrically conductive subsequent film is made from a material selected from the group consisting of conductive plastics, epoxies and combinations thereof, and exhibits a conductivity of about $5.2 \times 10^4$ S/m.

21. The method of claim 20, further including assembling the self-equalizing interconnect in a substrate to a semiconductive device.

22. A system in package computing system including a multiple-layer connector including a flexible self-equalized interconnect, comprising:

an electrically conductive first film with a first electrical conductivity, disposed on a dielectric layer, wherein the dielectric layer separates the electrically conductive first film from a reference plane, wherein the electrically conductive first film has a thickness of about 0.66 µm, and wherein the electrically conductive first film is made from a material selected from the group consisting of copper, silver, and combinations thereof;

an electrically conductive second film disposed on and contacting the electrically conductive first film, wherein the electrically conductive second film has a thickness of about 0.66 µm, wherein the electrically conductive second film is made from a material selected from the group consisting of brass, aluminum, aluminum alloys, metallic polymers, and plastics, and combinations thereof, and wherein the electrically conductive second film has a second electrical conductivity lower than the first electrical conductivity;

an electrically conductive third film disposed on and contacting the electrically conductive second film, wherein the electrically conductive third film has a thickness of about 5.3 µm, wherein the electrically conductive third film is made from a material selected from the group consisting of titanium, lead, conductive plastics and combinations thereof, and wherein the electrically conductive third film has a third electrical conductivity lower than the second electrical conductivity;

an electrically conductive subsequent film disposed above the electrically conductive third film, wherein the electrically conductive subsequent film has a thickness of about 59.0 µm, wherein the electrically conductive subsequent film is made from a material selected from the group consisting of conductive plastics, epoxies and combinations thereof, and wherein the electrically conductive subsequent film has a subsequent electrical conductivity lower than the third electrical conductivity;

wherein the multiple-layer connector is part of a device in the computing system selected from the group consisting of a flex cable, a high-speed interconnect, a semiconductive device package substrate, and a flexible printed wiring board; and wherein the system in package device is part of a chipset at uses a processor and a memory.

23. The multiple-layer connector including a flexible self-equalized interconnect of claim 22, wherein the self-equalizing interconnect exhibits a signal integrity less than 1 dB over the range from about 0.5 GHz to 10 GHz.

24. The multiple-layer connector including a flexible self-equalized interconnect of claim 22, wherein the system in package device is coupled to a display device.

* * * * *

UNITED STATES PATENT AND TRADEMARK OFFICE
CERTIFICATE OF CORRECTION

PATENT NO. : 10,886,209 B2
APPLICATION NO. : 16/326544
DATED : January 5, 2021
INVENTOR(S) : Hall et al.

Page 1 of 1

It is certified that error appears in the above-identified patent and that said Letters Patent is hereby corrected as shown below:

In the Claims

In Column 17, Line 5, in Claim 8, delete "pin," and insert --µm,-- therefor

In Column 17, Line 20, in Claim 10, delete "5.8×1.0$^7$" and insert --5.8×10$^7$-- therefor In Column 17, Line 27, in Claim 10, after "thereof,", delete "and,"

In Column 18, Line 50, in Claim 16, delete "electrically," and insert --electrically-- therefor In Column 19, Line 9, in Claim 20, after "thereof,", delete "and,"

In Column 19, Line 10, in Claim 20, delete "filth" and insert --film-- therefor

In Column 20, Line 33, in Claim 22, delete "at" and insert --that-- therefor

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*